United States Patent [19]

Bozler et al.

[11] Patent Number: 4,619,894

[45] Date of Patent: Oct. 28, 1986

[54] SOLID-TRANSFORMATION THERMAL RESIST

[75] Inventors: Carl O. Bozler, Sudbury; Daniel J. Ehrlich, Lexington, both of Mass.; Jeffrey Y. Tsao, Albuquerque, N. Mex.

[73] Assignee: Massachusetts Institute of Technology, Cambridge, Mass.

[21] Appl. No.: 722,818

[22] Filed: Apr. 12, 1985

[51] Int. Cl.[4] .............................................. C23C 15/00
[52] U.S. Cl. ................................... 430/942; 430/270; 430/276; 430/311; 430/325; 430/330; 430/945; 430/967; 156/628
[58] Field of Search ............... 430/270, 296, 311, 325, 430/330, 942, 945, 967; 156/628

[56] References Cited

U.S. PATENT DOCUMENTS

| | | | |
|---|---|---|---|
| 3,585,091 | 6/1971 | Lepselter | 156/16 |
| 3,622,319 | 11/1971 | Sharp | 96/27 |
| 3,674,580 | 7/1972 | Erdman | 156/13 |
| 3,867,148 | 2/1975 | O'Keeffe et al. | 96/36.2 |
| 3,873,341 | 3/1975 | Janus | 117/37 R |
| 4,132,586 | 1/1979 | Schaible et al. | 156/643 |
| 4,219,379 | 8/1980 | Athansas | 156/653 |
| 4,227,975 | 10/1980 | Hartman et al. | 204/15 |
| 4,289,574 | 9/1981 | Radigan et al. | 156/643 |
| 4,314,874 | 2/1982 | Abe et al. | 156/628 |
| 4,316,920 | 2/1982 | Brown et al. | 427/96 |
| 4,343,875 | 8/1982 | Spickenreuther | 430/5 |
| 4,350,729 | 9/1982 | Nakano et al. | 428/209 |
| 4,390,394 | 6/1983 | Mathuni et al. | 156/643 |
| 4,394,434 | 7/1983 | Rohloff | 430/270 |
| 4,460,413 | 7/1984 | Hirata et al. | 148/1.5 |

OTHER PUBLICATIONS

Properties of Aluminum-Base Cermet Thin Film Resistors, Thin Solid Films, pp. 275-285, J. Vac. Sci. Tech., B3(1), Jan./Feb. 1985.

Primary Examiner—John E. Kittle
Assistant Examiner—Patrick J. Ryan
Attorney, Agent, or Firm—Hamilton, Brook, Smith & Reynolds

[57] ABSTRACT

A negative resist and masking process for microfabrication comprising an evaporated film of aluminum and oxygen which, in the as-deposited state, is highly conductive and has low resistance to etching, but when exposed to active radiation, such as by pulse laser thermal excitation, converts to a low electrical conductivity, high etchant resistive phase.

13 Claims, 3 Drawing Figures

SOLID-TRANSFORMATION THERMAL RESIST

GOVERNMENT SUPPORT

Work described herein was supported by the U.S. Air Force under Contract No. F19(628)-83-C-0002.

TECHNICAL FIELD

The technical field to which the invention pertains is the field of metal oxide coatings for semiconductive metallic patterning and masking processes.

BACKGROUND ART

Conventional semiconductor masking processes involve microfabrication, that is, the definition of very small patterns of protective material, such as silicon dioxide, on a semiconductor surface. A dopant is introduced into the semiconductor body in the unprotected areas by diffusion, ion implantation or growth. Alternately, a layer of contrasting material, typically a metallizing ohmic contact layer, is formed on the unprotected areas by evaporation, or sputtering, or the like.

The mask for the masking process normally comprises a layer of photosensitive resist material formed on the surface of a protective $SiO_2$ layer on a substrate. Typical photo-resist materials comprise organic materials which undergo chemical changes, such as molecular cross-linking, when subjected to UV radiation. The photo-resist layer is illuminated with ultraviolet light passed through a photo mask containing the desired pattern to be formed in the photo-resist layer. The photo-resist layer is developed to expose selected portions on the $SiO_2$ layer and the exposed portions are dissolved by acid solutions. Next, the remaining resist material is stripped away and a dopant is introduced to the semiconductor through the unprotected portions of the pattern.

The foregoing process is subject to a number of deficiencies, especially when attempting to use this process for submicrometer patterning of thin films where extremely high resolution is required. Some of the problems associated with such conventional masking systems are the following:

The organic photoresist materials are not inert to acids nor resistant to plasma treatments creating difficulties in maintaining the integrity of the mask pattern. Generally, the organic resist material will not survive temperatures above 200° C., which may occur in subsequent processing of the semiconductor wafer. Such resists also contain carbon and require organic solvents which may cause contamination unless extreme precaution is used.

Organic light sensitive resists must usually be formed in layer thicknesses of about 1 micron for satisfactory operation. The resolution of a mask is inversely proportional to mask thickness. The thinner the mask, the better the resolution. To achieve better resolution, thin X-ray sensitive masks of organic material have been utilized, but these masks require relatively long exposure time.

Organic resist materials are spun onto the surface, thus requiring the introduction of spinning equipment into the process with attendant problems of contamination.

It would therefore be highly desirable to have a resist material which is more compatible with current semiconductor processing techniques, such as Chemical Vapor Deposition (CVD). Such a resist should be capable of being formed by vacuum coating in very thin layers (approximately 1000 A), and which do not employ organic materials and which are capable of maintaining integrity at temperatures in excess of 200° C.

Janus in U.S. Pat. No. 3,873,341, issued Mar. 25, 1975, proposes an alternate non-organic masking technique in which a layer of amorphous iron oxide is formed directly on the semiconductor substrate surface. The amorphous iron oxide layer is selectively heated by a thermal energy source, to crystallize certain portions of the iron oxide layer and form a selected pattern of crystalline iron oxide against a background of amorphous iron oxide.

The amorphous iron oxide is more sensitive to an acid wash than the crystalline iron oxide and can, therefore, be removed by the acid wash while leaving the crystalline iron oxide as a pattern mask. After the crystalline iron oxide is used as a mask for deposition or coating of the unprotected semiconductor surface, the pattern mask is removed by lapping the top surface.

The Janus thermal process contains distinct advantages over the prior art photo-resist techniques; chiefly, the attendant simplicity in eliminating the $SiO_2$ coating. However, there are still substantial shortcomings in the Janus process attendant to the use of amorphous iron oxide as the resist material and the necessity for crystallizing such material. The transformation of amorphous iron oxide to crystalline iron oxide requires the use of thin layers of less than 1500 A of amorphous iron oxide and the application of at least 100 joules/cm$^2$, to obtain the requisite temperature of 820° C. to achieve crystallization within 10 milliseconds. Such limitations of relatively high exposure dose and time and relatively high temperatures greatly decrease the practical applicability of the Janus technique for high resolution submicrometer patterning. Accordingly, a need exists for a simple thermal resist process which does not require as high a process temperature and exposure time as in the Janus process.

DISCLOSURE OF THE INVENTION

This invention discloses the use of an aluminum oxide film as a resist for patterning surface structures on semiconductor substrates. The Al/O layer, as deposited, has a low ohmic resistivity (high conductivity) and high resistance to chemical etching. When the Al/O layer is selectively exposed to raditaion, such as by heating selected areas, new metallurgical phases occur in the thermally treated areas of the Al/O layer resulting in markedly different chemical etching and electrical resistivity properties between heated and unheated regions. The heated regions become much less electrically conductive, and most importantly for resist purposes, they become much more resistive to etching. To put it another way, the heated areas become less etchable, or capable of being dissolved by etchants, such as, acid solutions, vapor etchants or reactive-ion etching techniques.

Consequently, the unheated portions, which remain highly etchable, can be removed by an etching process, such as, an acid bath leaving the pattern of the heated portions of the layer as a mask for further etching of underlying structure and/or introduction of dopants into the underlying area.

Furthermore, because the heated portions become substantially electrically non-conductive, such portions can be used as insulators for the circuitry formed in the semiconductor wafer or substrate.

The Al/O thermal resist of the invention is simple to apply, requiring only vacuum evaporation techniques. In comparison to the Janus resist, it has a much greater sensitivity and, therefore, shorter exposure time. It also can survive the high temperature and reactive dry-etching processes used in integrated circuit fabrication.

These properties of the resist lead to a number of critical advantages, which make Al/O suitable for future microfabrication lithography requirements. Specifically, the sensitivity of the material allows it to be exposed with single 20-ns laser pulses. This is a time much shorter than the period of mechanical and acoustic disturbances and therefore allows an important simplification in lithography instrument design. The dry etching resistance of the resist presents a means to circumvent the inconsistency that now exists with traditional organic resists in obtaining maximum resolution and simultaneously patterning a sufficiently thick (organic) resist to withstand dry etching.

It should also be noted that Al is a much more suitable element for use in silicon microfabrication than Fe, since it is presently used in other wafer processing steps. Also, Al/O is more stable then FeO. So much so, that it can survive at temperatures of 1000° C. or higher and thus can remain on the wafer during successive processing steps. It is also noted that the FeO of Janus cannot be used as a selectively convertible resist, when evaporated, since FeO has two convertible phases as-deposited, whereas Al/O has only one.

BEST MODE OF CARRYING OUT THE INVENTION

The present invention involves the use of a ceramic metal material, i.e., a cermet and, more specifically, the cermet aluminum oxide (Al/O) as a solid-transformation thermal resist.

A solid-transformation resist differs from widely used photo-resists and electron-beam resists in that solid transformation resists undergo a structural or compositional transformation when, exposed to a short burst of heat generated by a thermal source, such as a flashlamp, laser pulse, or pulsed ion or electron beam. Unlike organic optical or electron resists, solid transformation resists are inorganic materials. Rather than undergoing nonthermal changes, such as crosslinking or chain fracture as in polymeric resists; solid-transformation resists are thermally activated to form a latent image by solid-phase, morphological or compositional changes on transient heating.

Specifically, the aluminum oxide solid transformation resist of the invention, unlike the resist of Janus, does not depend upon conversion from an amorphous state to a crystalline state for its resist properties.

Figure 1:
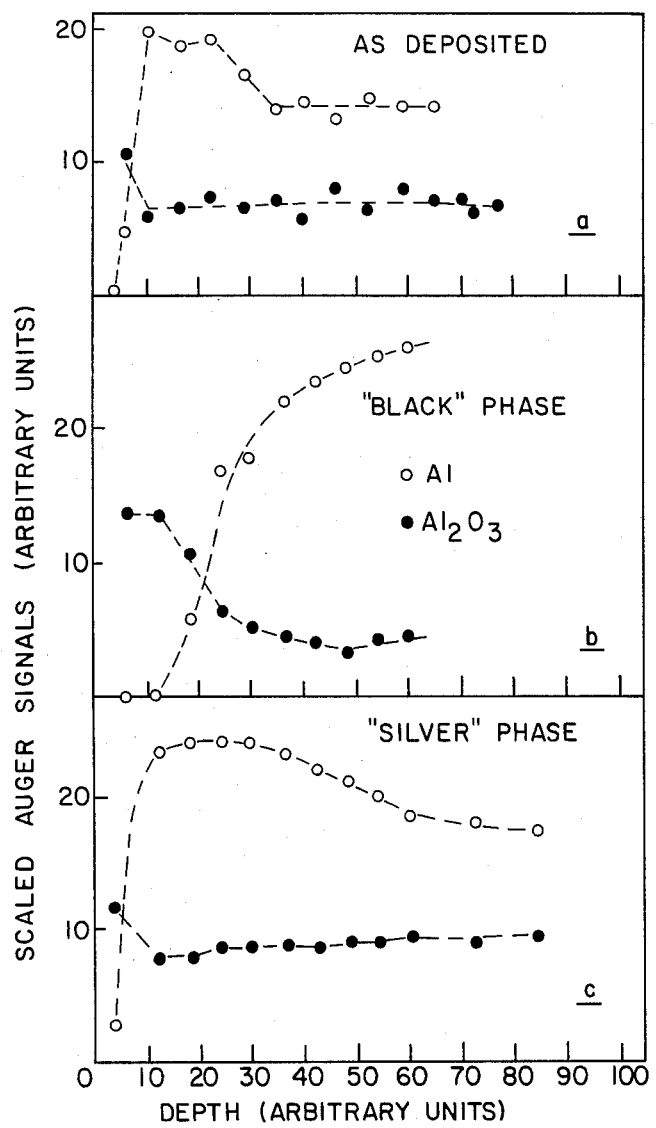
FIG. 1 is a plot of Auger signals versus depth (sputter time), (a) for an as deposited Al/O film, (b) for the film of (a) subjected to low power heating, and (c) for the film of (a) subjected to high power heating.

The nature of the transformation of Al/O may be explained in connection with FIG. 1 which is a plot of the resist composition, as determined by Auger spectroscopy versus depth of (a) an as-deposited Al/O film of 30 nanometer (nm) thickness formed by evaporating Al on an oxidized Si wafer in an $O_2$ ambient; (b) a similar plot after low power 100 mJ/cm$^2$ single-pulse excimer laser irradiation, and (c) a similar plot after high power (400 mJ/cm$^2$) single pulse excimer laser exposure.

As shown in FIG. 1a, the evaporated as-deposited film is a mixture of Al and $Al_2O_3$. In the as-evaporated condition (curve a) the films are smooth and shiny in appearance. After low power irradiation (curve b) the film turns black (black phase) after high power irradiation (curve c) the film takes on a silver appearance (silver phase). As evaporated, these Al/O films have a sheet resistance of about 1000 ohms/square and are smooth and shiny in appearance. The conversion process in these films was correlated with visible color changes by measurement of reflectance changes at 632.8 nm.

Figure 2:
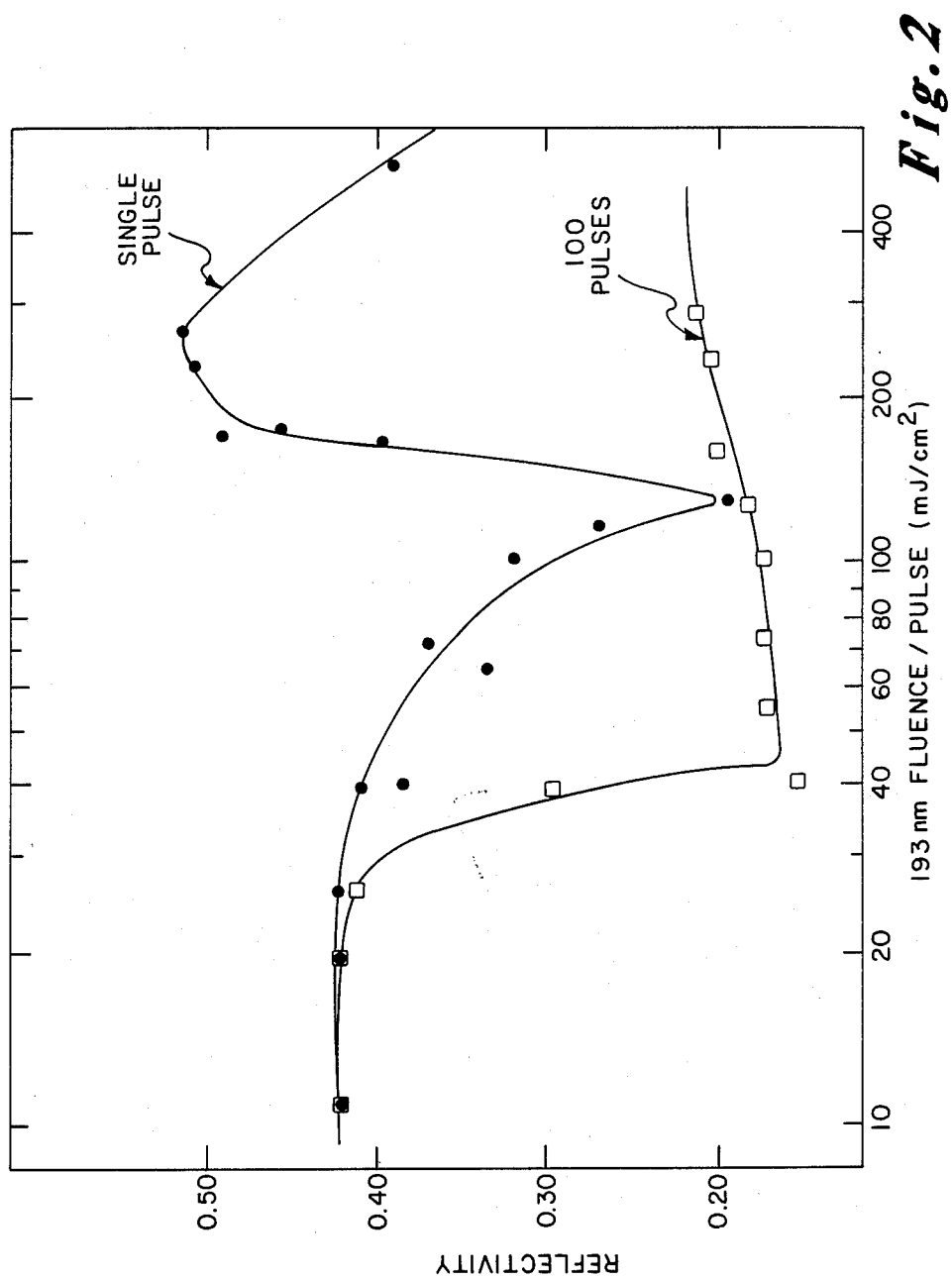
FIG. 2 is a plot 632.8-nm reflectance of a 30-nm-thick Al/O circuit film following 193 nm pulsed irradiation as a function of pulse fluence.

The power dependence of the transformation is shown in FIG. 2. After low-power single-pulse excimer laser irradiation (curve labelled "single pulse"), the films turn black. After higher-power irradiation the films are silvery. In the black phase the films have a sheet resistance of greater than 10$^6$ ohms/square. A second curve (labelled "100 pulses") shows the induced reflectance for a cumulative 100-pulse exposure. Note that a black phase is not formed in this high power exposure process. The irreversible transformation to the complete black phase occurs at approximately 1/5 of the peak fluence required using single pulses.

Figure 3:
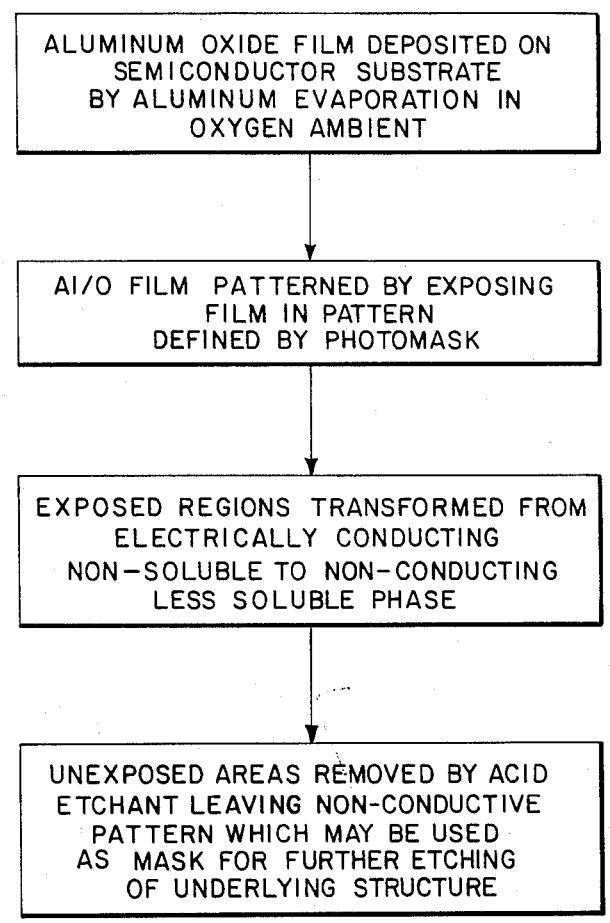
FIG. 3 is an outline of the method of forming a thermal resist pattern in accordance with the invention.

The process of resist mask formation may be explained in connection with FIG. 3. The first step in the process is to deposit a ceramic/metal (cermet) film of Al/O on a semiconductor wafer preferably by evaporation of Al in an $O_2$ ambient. Good films are obtained with room temperature evaporation at about 2–5×10$^{-6}$ Torr $O_2$ pressure. Al/O films of about 30 nm thickness, or less, may be readily formed in this manner. Next, the Al/O film is patterned in a predetermined manner by irradiating the film with active radiation, preferably by generating a pulsed UV excimer laser beam of radiation which is passed through a pattern defining photo-mask. Portions of the film are thus irradiated by the laser beam to heat the film portions in the pattern defined by the photo-mask. Alternatively, an electron beam, ion beam or Xenon flash lamp or X-ray source may be employed as the active radiation source. These alternate sources can be used to expose the resist to alternate, or additional, non-thermal type energy, for example, ion beam mixing in the case of an ion beam source.

The exposed regions of the film transform from an electrically-conducting metallic phase to an electrically-insulating phase which is much less soluble in phosphoric acid/$H_2O$ etchants. The unheated areas of the pattern are then removed in a phosphoric acid bath leaving the resist pattern in the transformed film layer for use as a mask for further etching of underlying structures.

The conductivity change induced by excimer pulses is of potential use for defining conductor patterns without any further treatment. Alternatively, the transformed material can be used as an etch mask to pattern underlying materials. For example, images can be transferred into $SiO_2$ by wet etching an exposed pattern of $SiO_2$ in nitric-acid/phosphoric-acid followed by reactive-ion etching in exposed $SiO_2$ in $CH_3F$.

It should be noted that the Al/O resist material has a sensitivity to thermal exposure which is approximately $10^3$ time greater than the Janus' value for the FeO resist system. This reduces the exposure dose by this same factor of $10^3$ and thus makes this new material practical for commercial mass-production circuit manufacture.

As mentioned above, this high sensitivity also permits single 20 ns pulse exposure over the full field of an integrated-circuit die with current laser sources. Single-pulse exposure will eliminate many of the most stringent requirements on vibration and acoustic control imposed on lithography instruments using multi-pulse exposure. The ability to expose materials at room temperature (in contrast to Janus' requirement of 820°) is also important, since high temperature causes thermal warping of the lithographic pattern which should be avoided in high-resolution processing.

EQUIVALENTS

This completes the description of the preferred embodiment of the invention. Those skilled in the art will recognize many equivalents to the specific embodiments described herein. For example, other elements, such as nitrogen, may be substituted for the oxygen as long as the combination produces a stable compound. Such equivalents are part of this invention and are intended to be covered by the following claims.

We claim:

1. A process for forming a selected pattern on the surface of a substrate, comprising:
   (a) forming on said substrate a substantially etchable, low ohmic resistivity cermet layer of aluminum and $Al_2O_3$ by depositing aluminum on said substrate in an oxygen environment;
   (b) heating selected regions of said cermet layer by exposing such selected regions to radiant energy to selectively transform said exposed regions from said substantially etchable low ohmic resistivity material to substantially less-etchable material higher ohmic resistivity; and
   (c) removing the unexposed regions to form a pattern of less etchable higher ohmic resistivity material on said substrate surface.

2. The process according to claim 1 in which said substrate comprises semiconductor material.

3. The process according to claim 1 in which said source of radiant energy is a source selected from the class consisting of electron beam, laser beam, flash lamps, ion bean and X-ray source.

4. The process according to claim 1 in which the temperature at deposition is less than 800° C.

5. The process of claim 1 in which the thickness of the as-deposited layer is about 30 nm.

6. A process for forming a selected pattern on the surface of a substrate, comprising:
   (a) forming on said substrate a substantially chemical etch resistant cermet layer of aluminum and an element selected from either oxygen or nitrogen by depositing aluminum on said substrate in an environment containing said element;
   (b) heating selected regions of said cermet layer by exposing such selected regions to thermal energy to selectively transform said exposed regions from substantially chemical etch resistant material to substantially chemically etchable material; and
   (c) removing the unexposed regions to form a pattern of substantially chemical etch resistant material on said substrate surface.

7. The process of claim 6 wherein the cermet layer is formed of Al and $Al_2O_3$.

8. The process of claim 7 wherein the cermet layer is formed by depositing aluminum in an oxygen ambient.

9. The process of claim 8 wherein the sheet resistance of the layer as-deposited is in the order of 100 ohms/square.

10. The method of forming a resist pattern comprising the steps of:
    (a) depositing a ceramic/metal film of Al/O on a semiconductor substrate by evaporating Al in an $O_2$ ambient at about $2-5 \times ^{-6}$ Torr;
    (b) irradiating selected portions of the film with active radiation passed through a pattern defined by a photo-mask to heat the selected portions of the film and transform the selected portions from an electrically-conducting metallic phase to an electrically-insulating phase much less soluble to certain acid etchants than in the metallic phase;
    (c) removing the unheated portions of the film with an acid etchant leaving a resist pattern in the transformed film layer for use as a mask for further etching of the underlying substrate structure.

11. The method of claim 10 wherein the irradiation is achieved by a single laser pulse of 20 ns.

12. The method of claim 10 wherein the irradiation occurs at ambient temperature below the warping temperature of the pattern.

13. The method of claim 10 wherein the irradiation takes place at temperatures below 800° C.

* * * * *